United States Patent [19]

Okumura et al.

[11] Patent Number: 4,502,210

[45] Date of Patent: Mar. 5, 1985

[54] METHOD FOR MANUFACTURING SEMICONDUCTOR DEVICE

[75] Inventors: Katsuya Okumura, Yokohama; Toshinori Shinki, Tokyo; Takashi Sato, Kawasaki; Masaaki Ueda, Yokohama, all of Japan

[73] Assignee: Tokyo Shibaura Denki Kabushiki Kaisha, Japan

[21] Appl. No.: 502,265

[22] Filed: Jun. 8, 1983

[30] Foreign Application Priority Data

Jun. 28, 1982 [JP]  Japan ................... 57-111128

[51] Int. Cl.³ ............... H01L 23/48; H01L 23/50
[52] U.S. Cl. ......................... 29/591; 29/571; 29/582; 148/1.5; 148/187; 357/65; 357/68; 357/85
[58] Field of Search .......... 148/1.5, 187; 29/571, 29/576 B, 589, 591, 582; 357/65, 85, 40, 68

[56]  References Cited
U.S. PATENT DOCUMENTS 3,889,359  6/1975  Rand ....................... 29/590 X
4,045,594  8/1977  Maddocks ................. 427/89
4,258,078  3/1981  Celler et al. ............... 427/43.1
4,327,477  5/1982  Yaron et al. ............... 29/576 B
4,362,597  12/1982  Fraser et al. .............. 156/661.1 X

FOREIGN PATENT DOCUMENTS 0057424  1/1975  Australia .
0019781  10/1980  European Pat. Off. .

Primary Examiner—Brian E. Hearn
Assistant Examiner—David A. Hey
Attorney, Agent, or Firm—Finnegan, Henderson, Farabow, Garrett & Dunner

[57]  ABSTRACT

A semiconductor device is manufactured by selectively removing an insulating film which covers at least one conductive layer to form at least one contact hole partially exposing the conductive layer. Then, a layer of an inorganic conductive material having a melting point lower than the material comprising the conductive layer is formed on a surface of the insulating film and is melted to fill the contact hole with the inorganic conductive material. Finally a wiring layer is formed in contact with the inorganic conductive material filled in the contact hole.

12 Claims, 13 Drawing Figures

METHOD FOR MANUFACTURING SEMICONDUCTOR DEVICE

BACKGROUND OF THE INVENTION

1. Field of the Invention

The present invention relates to a method for manufacturing a semiconductor device, and more particularly, to a method for forming a wiring layer in contact with an underlying conductive layer which is partially exposed through a contact hole formed in an insulating film.

2. Description of the Prior Art

Recently, semiconductor devices have been more micropatterned and packing density has increased. Along with this, the manufacturing process has become increasingly complicated. For example, a thick insulating film of a multilayer structure is formed on a semiconductor substrate having many element regions formed therein, contact holes are formed in the insulating film so as to expose the element regions, respectively, and a wiring layer is deposited to contact each element region through each contact hole.

From the viewpoints of high packing density and micropatterning of semiconductor devices, each element region formed in the semiconductor substrate must be miniaturized. Furthermore, the contact holes exposing the element regions must be miniaturized and formed as accurately as possible. The most advanced technique now available for forming such a contact hole is anisotropic etching such as reactive ion etching (RIE). As is well known, a lateral etching or an undercut does not occur in anisotropic etching. As a result, a contact hole having substantially the same shape as that of an opening of a mask used, that is, a contact hole having a steep side wall can be formed in an insulating film.

However, even if a small contact hole is formed by anisotropic etching, a problem occurs when a wiring layer is deposited therein. The problem will now be described with reference to FIG. 1 which shows an enlarged section of an n-channel MOS transistor. The semiconductor device shown in FIG. 1 has a p-type substrate 1. Source and drain regions 3 and 4 are formed in an island region isolated by a field oxide film 2. A channel stop layer 5 is formed under the field oxide film 2. A gate electrode 6 is formed through a gate oxide film 7 on part of a surface of the substrate 1 which corresponds to an area between the source and drain regions 3 and 4. A thick insulating film 8 of a multilayer structure is formed to cover the entire surface of the structure. A contact hole 9 is formed in the insulating film 8, partially exposing the drain region 4. If the contact hole 9 is formed by the RIE, a side wall 9a thereof becomes steep, that is, substantially vertical. The contact hole 9 is formed as small as possible (e.g., 1.5 μm square or less) for micropatterning of the semiconductor device.

When aluminum 10 is deposited to form an electrode wiring layer on the drain region 4 through the small contact hole 9 having the steep side wall 9a, an aluminum overhang 10a is formed over the contact hole 9. Aluminum is not substantially deposited on the drain region 4 and the side wall 9a or it is deposited very thinly as shown by portions indicated by reference numerals 10b or 10c. When aluminum is deposited in this manner, the overhang 10a grows to contact each other and a hollow portion 11 is formed in the aluminum layer 10 in the contact hole 9, as shown in FIG. 1. Once this occurs, aluminum cannot be deposited on a bottom surface of the hollow portion even if an aluminum layer 10' is further formed on the aluminum layer 10.

It is apparent that a satisfactory electrode wiring layer cannot be obtained by patterning the aluminum layer 10 having the hollow portion 11.

This problem also occurs in contacting the wiring layer with another wiring layer through the contact hole formed in an insulating film.

In order to solve the above problem, a method has been proposed to deposit aluminum while the substrate is heated. However, similar to the above-mentioned case, only a thin aluminum layer is deposited on a side wall of a contact hole. Therefore, a semiconductor device having an aluminum film as an electrode deposited in this manner has low reliability.

SUMMARY OF THE INVENTION

It is, therefore, an object of the present invention to provide a method for forming a wiring layer which is connected to a conductive layer through a contact hole with high reliability even if the contact hole is very small, thus providing a high-density semiconductor device with high reliability at high yield.

According to the method for manufacturing a semiconductor device of the present invention, an insulating film which covers at least one conductive layer is selectively removed to form at least one contact hole partially exposing the conductive layer. A layer of an inorganic electrically conductive material is deposited on an entire surface of the insulating film which includes the contact hole. The inorganic conductive material has a melting point lower than that of the conductive layer. The inorganic conductive material layer is then melted to fill the contact hole with the inorganic conductive material. A wiring layer is then deposited to contact the inorganic conductive material embedded in the contact hole.

According to the present invention, the inorganic conductive material layer is formed in the contact hole before the wiring layer is formed. The contact hole is substantially filled with the inorganic conductive material by melting the inorganic conductive material layer. As a result, irrespective of the fact that the contact hole is very small and has a steep side wall, the wiring layer to be formed later is brought into good electrical contact with the conductive layer through the inorganic conductive material which sufficiently contacts the conductive layer in the contact hole. As a result, a semiconductor device can be manufactured so as to have a high packing density by miniaturization of the contact hole. The conductive layer and the wiring layer satisfactorily contact each other through the small contact holes, thereby providing high reliability.

The term "conductive layer" as used in the specification and the appended claims means a semiconductor substrate, a semiconductor region formed in the semiconductor substrate, an electrode layer, and a wiring layer formed in a semiconductor device.

DETAILED DESCRIPTION OF THE PREFERRED EMBODIMENTS

Figure 1:
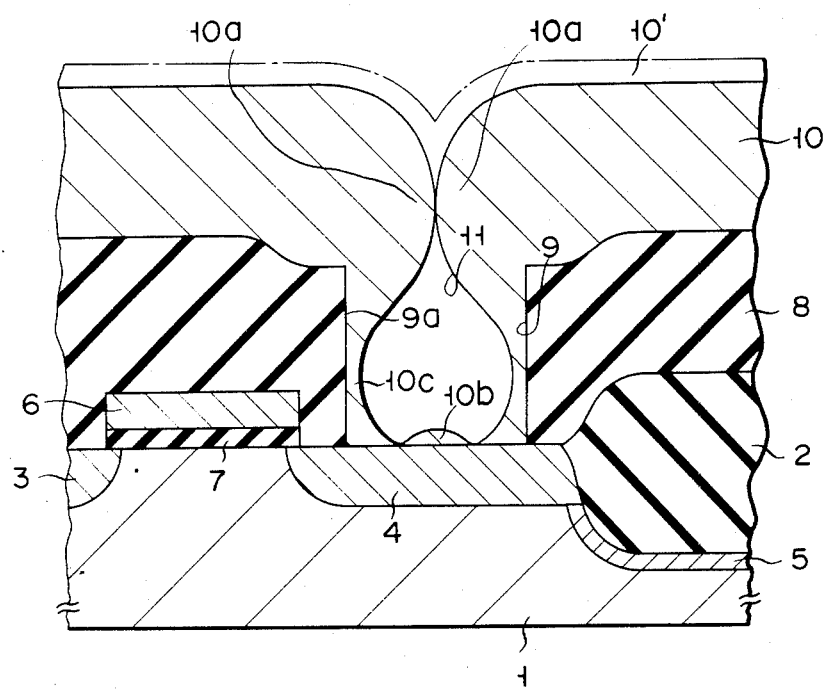
FIG. 1 is a sectional view for explaining a conventional method for forming an electrode wiring layer.

The present invention will now be described with reference to the accompanying drawings. The same reference numerals denote the same parts throughout the drawings.

Figure 2A:
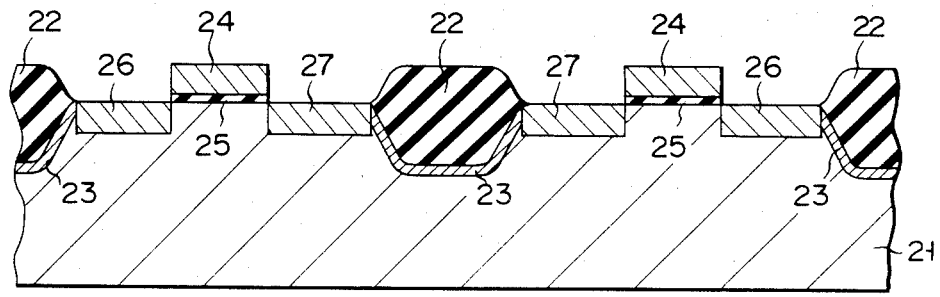
FIGS. 2A to 2F are respectively sectional views for explaining the steps of a method for manufacturing a semiconductor device according to an embodiment of the present invention.

FIGS. 2A to 2F show a first embodiment wherein the invention is applied to the manufacture of an n-channel MOSLSI. Referring to FIG. 2A, a p-type impurity such as boron is selectively ion-implanted in predetermined regions of a p-type silicon substrate 21. Thereafter, the ion-implanted regions are oxidized to form field oxide films 22 so as to divide the substrate 21 into island regions. At the same time the boron-doped regions of the substrate 21 are forced downward by the field oxide films 22 so as to form $p^-$-type channel stop layers 23.

After a thin thermal oxide film is formed to cover the entire surface of each island region, a phosphorus-doped polycrystalline silicon film is then deposited on the entire surface thereof. The doped polycrystalline silicon film is patterned to form gate electrodes 24. The thermal oxide film is selectively etched using the gate electrode 24 as a mask to form gate oxide films 25 under the gate electrodes 24. Subsequently, an n-type impurity such as arsenic is ion-implanted in each island region using the gate electrode 24 and the field oxide film as a mask and then activated, thereby forming an $n^+$-type source region 26 and an $n^+$-type drain region 27 in each island region.

Figure 2B:
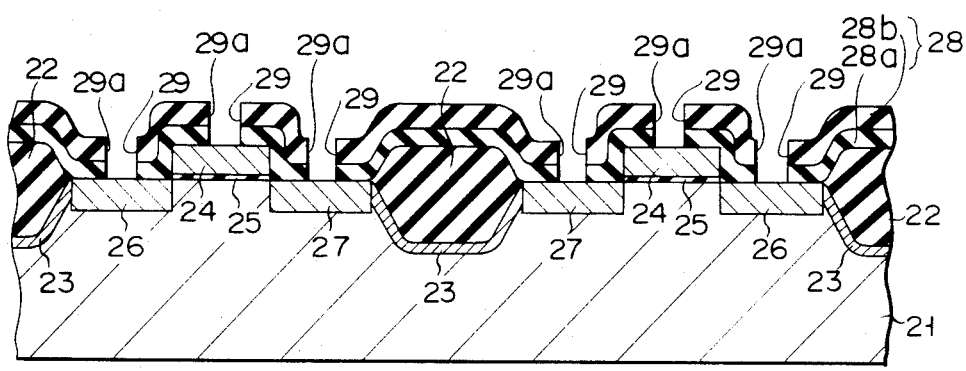

Referring to FIG. 2B, an insulating film 28 is formed on the entire surface of the structure shown in FIG. 2A. In this embodiment, the insulating film 28 has a bilayered structure consisting of an underlying silicon dioxide layer 28a formed by chemical vapor deposition (CVD) and a phosphosilicate glass layer 28b formed thereon. The insulating film 28 is selectively etched to form contact holes 29 partially exposing the source and drain regions 26 and 27 and gate electrodes 24, respectively. The small contact holes 29 are formed by anisotropic etching (e.g., RIE) in order to obtain a highly integrated semiconductor device. Anisotropic etching is well known to those skilled in the art. By adopting anisotropic etching, small (e.g., 1.5 μm square or less) contact holes 29 can be obtained which have substantially the same size as that of the opening of a mask used. The contact hole 29 of this type has a steep (substantially vertical) side wall 29a as shown in FIG. 2B.

As previously mentioned with reference to FIG. 1, when a metallic material is vacuum-deposited in order to form electrode wiring layers which contact the drain and source regions 26 and 27 and the gate electrodes 24, respectively, through the contact holes 29 each of which has the steep side wall 29a, satisfactory electrode wiring layers cannot be obtained.

Figure 2C:
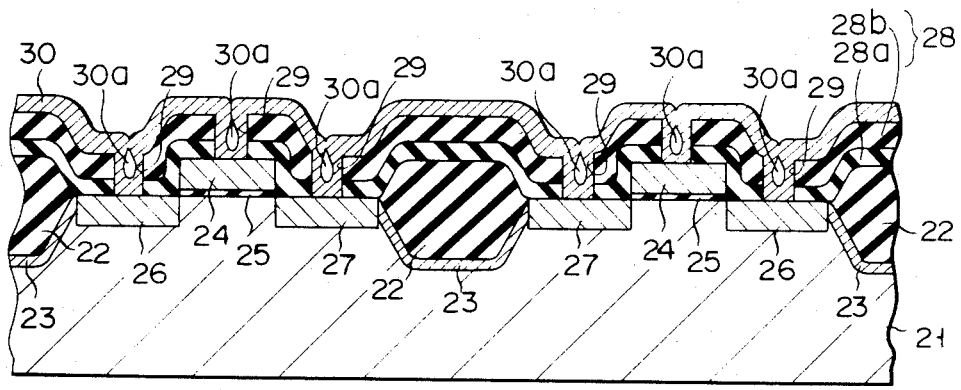

In order to overcome this problem, according to the present invention, a layer 30 of an inorganic conductive material is deposited by vacuum deposition such as vapor deposition, sputtering, and the like, on the entire surface of the structure (FIG. 2B), as shown in FIG. 2C. The inorganic conductive material must have a melting point lower than that of a material (silicon in this case) constituting the semiconductor substrate. This is because the substrate may not be melted when a heat treatment is performed (to be described later). In the first embodiment of the present invention, an aluminum-silicon alloy (silicon content of 11.3 atomic %; a melting point of 577° C.) is used as the inorganic conductive material. The silicon substrate 21 may be heated to, for example, 350° C. when the aluminum-silicon alloy is deposited.

However, the same problem as described with reference to FIG. 1 occurs when the inorganic conductive material is deposited. That is, the thin inorganic conductive material layer 30 is formed only thinly on the side wall or a bottom of each contact hole 29, as schematically shown in FIG. 2C, thus forming a hollow portion 30a in each relatively deep contact hole 29 (e.g., a depth from 1.0 μm to 1.5 μm). Therefore, the inorganic conductive material is heated and melted. The melted inorganic conductive material easily flows into each contact hole 29 and is completely (without a hollow portion) filled therein. The heat treatment can be conducted on the inorganic conductive material layer 30 as deposited on the entire surface of the structure shown in FIG. 2B. In this case, after the inorganic conductive material layer 30 is melted and cooled, part of the cooled inorganic conductive material layer 30 remaining on the insulating film 28 is etched back to leave a columnar portion 31 (FIG. 2E) only in the corresponding contact hole 29. If the inorganic conductive layer 30 as deposited is thin, it sometimes does not remain, after melting and cooling, as a continuous layer because of the surface tension.

Figure 2D:
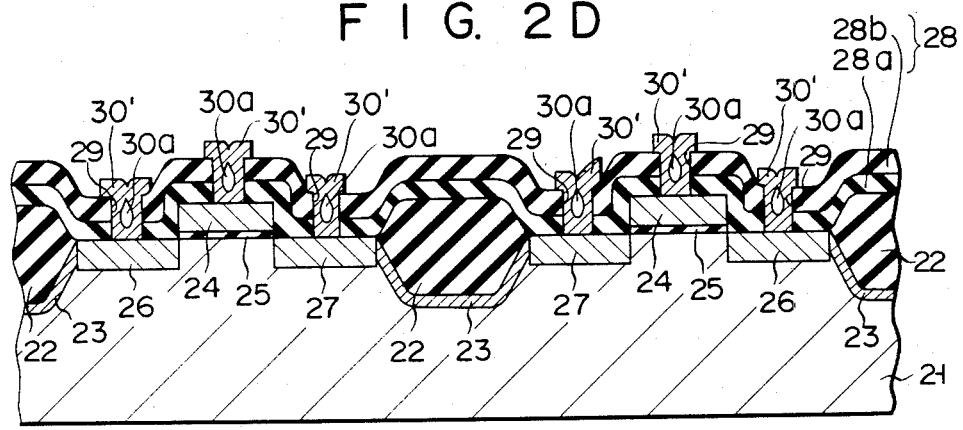
Figure 2E:
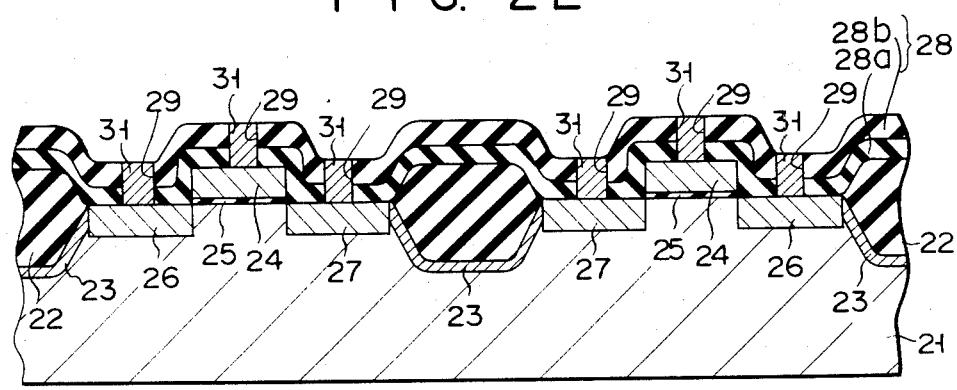

In such a case, as shown in FIG. 2D, after the inorganic conductive material layer 30 is formed as described above, it is selectively etched so as to leave residual portions 30' on an upper part of the contact holes 29. In this case, each portion 30' has a volume sufficient to fill the hollow portion 30a with the inorganic conductive material. Thereafter, the portion 30' is melted and then solidified to obtain a columnar portion 31 (FIG. 2E) which completely fills the contact hole 29. Selective etching of the inorganic conductive material layer 30 is preferably performed such that the portion 30' extends over a part of the insulating film 28 around the contact hole 29. This allows the contact hole 29 to be uniformly filled with the melted inorganic conductive material in the subsequent melting process. The columnar portion 31 sometimes slightly extends out of the contact holes 29 after cooling. However, this extended portion provides no problem.

The method for melting the inorganic conductive material layer is not critical as long as the inorganic conductive material layer is melted by such a method so as to substantially fill the contact hole 29. Accordingly, the inorganic conductive material layer can be heated at its melting point for a predetermined period of time. However, it is preferable to use so-called rapid annealing or flash annealing. This technique involves instantaneously melting the inorganic conductive material by radiant heat from an infrared lamp or a carbon heater heated to a very high temperature (e.g., 2,000° C.) The melted conductive material is cooled at once thereafter. With this annealing, melting can be performed very quickly. Furthermore, the heat is used only for melting the inorganic conductive material and is substantially not conducted to the semiconductor substrate.

Especially, when a material whose conductivity may be decreased or lost by oxidation (particularly aluminum-based metallic material such as aluminum or an aluminum alloy having aluminum as its main component, e.g., an aluminum-silicon alloy or aluminum-silicon-copper alloy) is used as the inorganic conductive material, it is preferable to melt such a material in a nonoxidizing atmosphere which has substantially no oxidizing component such as oxygen or water. Therefore, if the aluminum-based metallic metallic material is used as the inorganic conductive material, it is preferably melted at a high vacuum ($10^{-7}$ Torr or lower). Alternatively, the aluminum-based material is melted in an inert gas (e.g., argon) atmosphere including gaseous oxidizing components at a partial pressure of no more than $10^{-7}$ Torr.

Figure 2F:
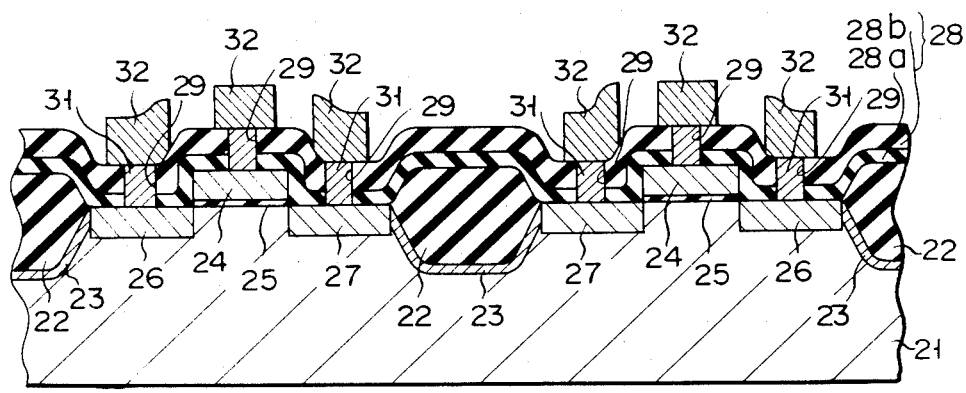

The columnar portions 31 filling the contact holes 29 are thus formed in the above-mentioned manner. Then, a conventionally used electrode wiring metallic material, e.g., an aluminum-silicon alloy (silicon content of 1 atomic %) is deposited on the entire surface of the structure shown in FIG. 2E and is patterned to leave parts which are each in contact with each columnar portion 31, thus obtaining electrode wiring layers 32 as shown in FIG. 2F. Thus, the desired n-channel MOSLSI is prepared.

According to the present invention, even if the contact holes are small in size and have a steep side wall, the electrode wiring layers have sufficient electrical contact with the source and drain regions, and gate electrodes, because they contact the columnar portions of the inorganic conductive material filling the contact holes. Therefore, the present invention greatly contributes to high packing density and high reliability of semiconductor devices.

If aluminum-based metallic material is used as the inorganic conductive material in the above-noted first embodiment of the present invention, aluminum in the aluminum-based metallic material may react with the substrate silicon exposed through the contact hole, resulting in an aluminum spike or damage to the junctions at the source and drain regions. In order to solve this problem, a second embodiment is proposed and described below with reference to FIGS. 3A to 3B.

Figure 3A:
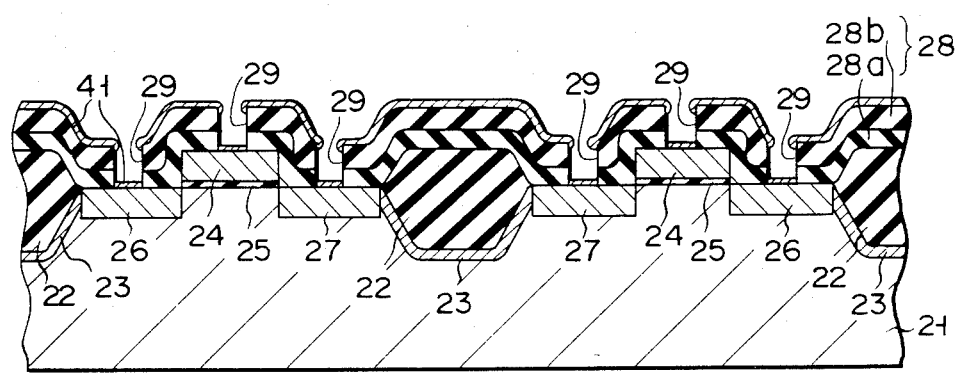
FIGS. 3A to 3C are respectively sectional views for explaining the steps of a method for manufacturing a semiconductor device according to a second embodiment of the present invention.

Referring to FIG. 3A, after the structure shown in FIG. 2B is formed as described above, a platinum layer 41 is formed on the structure. Within the contact holes 29 it is sufficient for the platinum to be deposited only on the bottom surface of the contact holes 29 (i.e., the substrate surface portions exposed through the contact holes 29). The platinum may be deposited to a small thickness of, e.g., 1000 to 1500 Å.

Figure 3B:
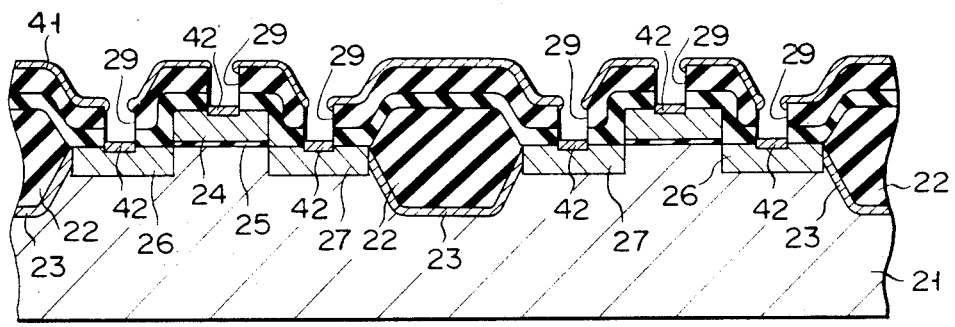

The structure thus obtained is subjected to a heat treatment in an inert gas (e.g., nitrogen gas) atmosphere so that the platinum contacting the surface of the substrate 21 reacts with the substrate silicon, thus forming a platinum silicide ($PtSi_2$) layer 42 (FIG. 3B). Then, the platinum layer which remains on the insulating film 28 is removed by aqua regia or the like. In this case, the platinum silicide layer 42 is not removed.

Figure 3C:
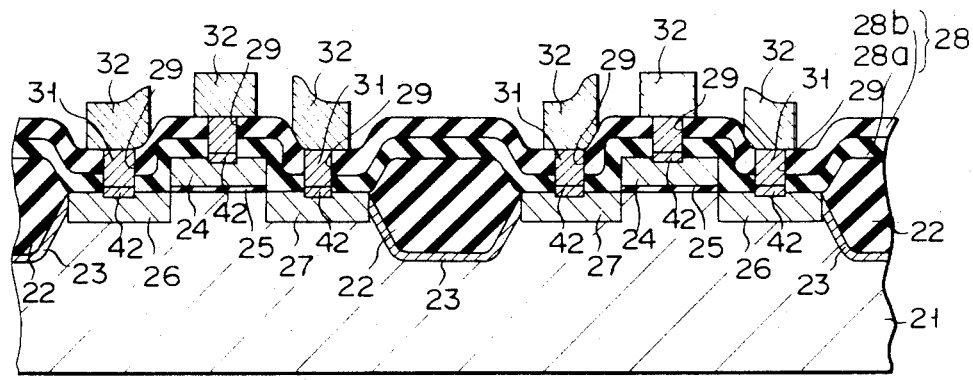

Subsequently columnar portions 31 of the aluminum-based metallic material, and electrode wiring layers 32 are formed in the same manner as described with reference to FIGS. 2C to 2F. Thus, the desired n-channel MOSLSI is obtained as shown in FIG. 3C.

If the platinum silicide layers 42 are formed at least at parts of the surface of the silicon substrate exposed through the contact holes 29 before the columnar portions 31 are formed, aluminum contained in the aluminum-based metallic material is prevented from directly contacting the substrate silicon due to the platinum silicide layers 42 (barrier layers) when the aluminum-based metallic material is melted. As a result, according to the second embodiment of the present invention, the junction damage caused by the aluminum spike can be prevented. The second embodiment is particularly effective when the junctions of the source and drain regions are shallow due to the miniaturization of the element. This barrier layer is not limited to the above-mentioned platinum silicide layer. A refractory metal such as palladium, hafnium, tantalum, titanium, nickel, niobium, zirconium, vanadium, molybdenum, tungsten, a silicide thereof with the substrate silicon (this is most preferable), or an alloy thereof may be used. When a metal silicide layer is formed as a barrier, the structure corresponding to the structure shown in FIG. 2B may be exposed to an atmosphere of a corresponding metal fluoride (e.g., $WF_6$). The metal fluoride is made to react with the silicon of part of the substrate which is exposed through the contact holes 29 to obtain a corresponding metal silicide ($WF_6 + 2Si \rightarrow WSi_2 + 3F_2$).

Particularly, if a silicide layer is used as the barrier layer, the resistance of the silicide layer is small. Therefore, even if a contact area of each columnar portion and the semiconductor regions 26 and 27 and gate electrodes 24 is small, the increase in contact resistance can be prevented, thereby contributing to the realization of high-speed operation of the semiconductor device.

Further, the barrier layer such as the silicide layer can be formed before the insulating layer 28 is formed. In this case, the structure as shown in FIG. 2A is subjected to thermal oxidization to form a thin oxide film on the exposed substrate surface and a thick oxide film on the top and side surfaces of the doped polycrystalline silicon 24. The thin oxide film is etched, and the refractory metal is formed on the entire surface of the resultant structure. The structure thus obtained is heat-treated to form the silicide layers on the source and drain regions 26 and 27.

A third embodiment wherein the present invention is applied to the connection of the multilayer wiring layer will now be described with reference to FIGS. 4A and 4B.

Figure 4A:
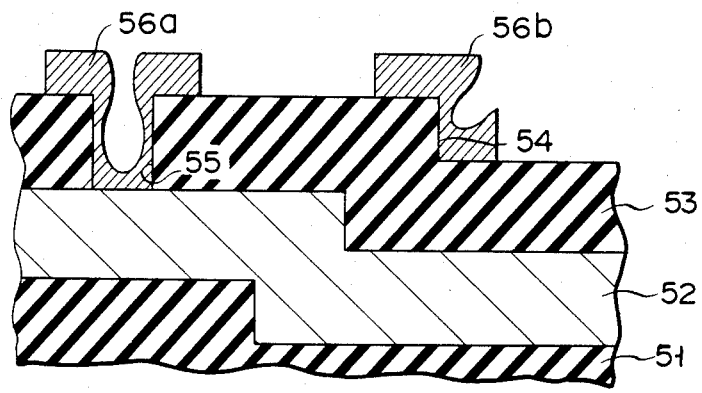
FIGS. 4A and 4B are respectively sectional views for explaining the steps of a method for manufacturing a semiconductor device according to a third embodiment of the present invention.
Figure 4B:
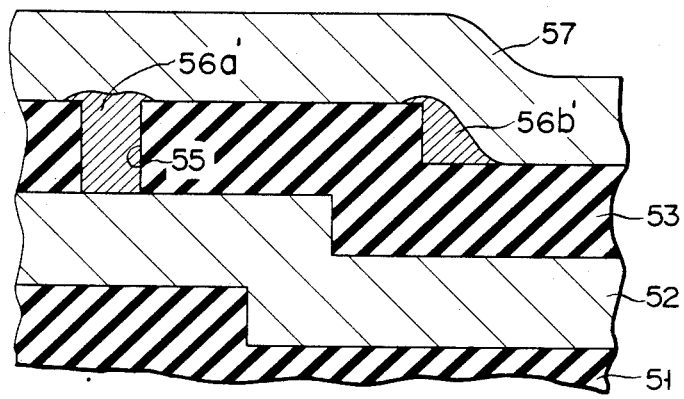
Figure 5:
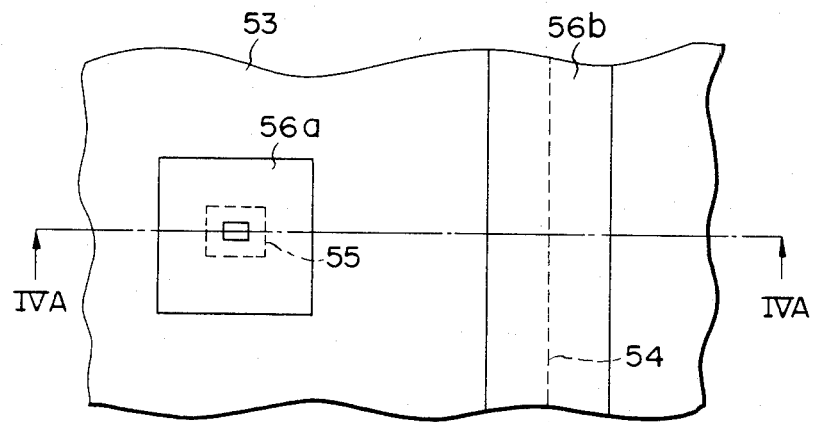
FIG. 5 is a plan view of the structure shown in FIG. 4A.

Referring to FIG. 4A, after an insulating film 51 is formed on a semiconductor substrate (not shown) having predetermined semiconductor regions formed therein, a wiring layer such as an aluminum layer 52 as a first wiring layer is formed thereon. Subsequently, an insulating film 53 is formed on the aluminum layer 52, and a contact hole 55 is formed by anisotropic etching in the insulating film 53 to partially expose part of the aluminum layer 52 underlying the insulating film 53. Thereafter, the inorganic conductive material (e.g., an aluminum-silicon alloy) having a melting point lower than that of aluminum of the wiring layer 52 is formed by sputtering on the entire surface of the obtained structure. The resultant aluminum-silicon alloy layer is patterned so as to leave portion 56a which covers the contact hole 55 and its peripheral portion. If the insulating film 53 has a stepped portion 54, the aluminum-silicon alloy layer is also left at the inside corners of the step 54, as shown at 56b. The portion 56b of the aluminum-silicon alloy has a recess in the stepped portion 54. FIG. 5 is a plan view of the resultant structure.

The aluminum-silicon alloy portions 56a and 56b are then melted (e.g., by heating at a temperature of 590° C.) in a nonoxidizing atmosphere in the same manner as in the first embodiment of the present invention. The portion 56a is melted to fill the contact hole 55 and is cooled to form a columnar portion 56a'. On the other hand, the part 56b fills the recess and is cooled to form a portion 56b' which covers the steep stepped portion (FIG. 4B). A wiring metal such as aluminum-silicon alloy is deposited on the entire surface of the obtained structure, and is patterned to form a second wiring layer 57 which is connected with the aluminum layer 52 through the columnar portion 56a'.

According to the third embodiment of the present invention, the second wiring layer 57 which is properly connected to the first wiring layer 52 can be formed. In addition, since the melted aluminum-silicon alloy portion 56b' is formed on the stepped portion 54 of the second insulating film 53, poor step coverage of the second wiring layer 57 at the stepped portion 54 can be prevented.

Although the present invention has been described above with reference to the particular embodiments, it is to be understood that the present invention is not limited to them. Particularly, the inorganic conductive material used for filling the contact hole is not limited to the aluminum-based metallic material. Any conductive material can be used as a material for filling the contact hole if it has a melting point lower than that of the material of the conductive layer which is exposed through the contact hole and if it has a good affinity for the material of the wiring layer and/or the material of the conductive layer. Combinations of the inorganic conductive material layer and the conductive layer are, for example, the aluminum-based metallic material for silicon, the aluminum-based metallic material or tin for silicon having a silicide barrier layer, and an aluminum alloy or tin for aluminum. Further, the present invention can also be applied to the formation of a wiring layer on an insulating film having a steep portion without discontinuity at the stepped portion, as described above with reference to the third embodiment.

What we claim is:

1. A method for manufacturing a semiconductor device having a lateral area of 1.5 μm square or less and a depth of 1.0 to 1.5 μm, comprising the steps of:
   (a) selectively removing an insulating film which covers at least one conductive layer to form at least one contact hole partially exposing said conductive layer;
   (b) forming a layer of an inorganic conductive material on an entire surface of said insulating film which includes said contact hole, said inorganic conductive material having a melting point lower than the melting point of the material comprising said conductive layer;
   (c) melting said inorganic conductive material layer sufficiently to fill said contact hole with said inorganic conductive material;
   (d) removing portions of said inorganic conductive material layer remaining on said insulating film after said inorganic conductive material layer is melted, thereby providing a columnar body filling said contact hole and comprising said inorganic conductive material; and
   (e) forming a wiring layer in contact with said columnar body.

2. A method for manufacturing a semiconductor device having a lateral area of 1.5 μm square or less and a depth of 1.0 to 1.5 μm, comprising the steps of:
   (a) selectively removing an insulating film which covers at least one conductive layer to form at least one contact hole partially exposing said conductive layer;
   (b) forming a layer of an inorganic conductive material on an entire surface of said insulating film which includes said contact hole, said inorganic conductive material having a melting point lower than that of the material comprising said conductive layer;
   (c) selectively removing said inorganic conductive material layer to leave a part thereof only in and over said contact hole, including a peripheral portion of said contact hole, said part of said inorganic conductive layer having a volume sufficient to substantially fill up any unfilled hollow in said contact hole with said part;
   (d) melting said part of the inorganic conductive material layer sufficiently to fill said contact hole with said inorganic conductive material, thereby providing a columnar body filling said contact hole and comprising said inorganic conductive material; and
   (e) forming a wiring layer in contact with said columnar body.

3. A method according to claim 1 or 2, wherein said contact hole is formed by anisotropic etching and has a steep side wall.

4. A method according to claim 3 or 2, wherein said inorganic conductive material layer is formed by vacuum deposition.

5. A method according to claim 4, wherein said inorganic conductive material layer is melted in a nonoxidizing atmosphere.

6. A method according to claim 5, wherein said nonoxidizing atmosphere comprises a gaseous oxidizing component at a pressure of no more than $10^{-6}$ Torr.

7. A method according to claim 5, wherein said inorganic conductive material comprises an aluminum-based metallic material.

8. A method according to claim 4, wherein said conductive layer comprises a semiconductor region formed by doping an impurity in a semiconductor substrate.

9. A method according to claim 8, wherein said semiconductor substrate is a silicon substrate.

10. A method according to claim 9, wherein said inorganic conductive material comprises an aluminum-based metallic material.

11. A method according to claim 10, further comprising forming a layer of a refractory metal selected from the group consisting of platinum, palladium, hafnium, tantalum, titanium, nickel, niobium, zirconium, vanadium, molybdenum and tungsten; an alloy thereof; or a silicide thereof on at least a surface portion of said semiconductor substrate exposed through said contact hole, before said inorganic conductive material layer is formed.

12. A method according to claim 4, wherein said inorganic conductive material is selected from the group consisting of an aluminum-based metallic material and tin.

* * * * *